United States Patent [19]
Pasch

[11] Patent Number: 6,068,879
[45] Date of Patent: *May 30, 2000

[54] USE OF CORROSION INHIBITING COMPOUNDS TO INHIBIT CORROSION OF METAL PLUGS IN CHEMICAL-MECHANICAL POLISHING

[75] Inventor: Nicholas F. Pasch, Pacifica, Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/918,360

[22] Filed: Aug. 26, 1997

[51] Int. Cl.[7] .............................. B05D 5/12; H01L 21/461
[52] U.S. Cl. ........................... 427/97; 427/307; 216/692; 216/693; 438/692; 438/959
[58] Field of Search ................................ 427/96, 97, 307; 106/14.41, 14.42, 14.43; 51/308; 216/692, 693; 438/959, 692

[56] References Cited

U.S. PATENT DOCUMENTS

| | | |
|---|---|---|
| 3,816,185 | 6/1974 | Toledo et al. ........................ 148/6.24 |
| 3,868,217 | 2/1975 | Hollingshad ........................... 21/2.7 A |
| 4,343,660 | 8/1982 | Martin .................................... 148/6.14 |
| 4,497,713 | 2/1985 | Geiger .................................... 210/699 |
| 4,649,025 | 3/1987 | Hwa et al. ................................ 422/15 |
| 4,663,053 | 5/1987 | Geiger .................................... 210/699 |
| 5,017,029 | 5/1991 | Andou et al. .......................... 400/237 |
| 5,533,635 | 7/1996 | Man .......................................... 216/67 |
| 5,607,718 | 3/1997 | Sasaki et al. ............................. 427/97 |
| 5,637,185 | 6/1997 | Murarka et al. ........................... 438/5 |
| 5,664,989 | 9/1997 | Nakata et al. ............................ 451/41 |
| 5,735,963 | 4/1998 | Obeng ........................................ 134/3 |

*Primary Examiner*—Brian K. Talbot
*Attorney, Agent, or Firm*—Beyer & Weaves, LLP

[57] ABSTRACT

A process of inhibiting a corrosion of metal plugs formed in integrated circuits is described. The corrosion inhibiting process includes providing a partially fabricated integrated circuit surface including the metal plugs on a polishing pad to carry out chemical-mechanical polishing, introducing slurry including a corrosion inhibiting compound on the polishing pad in sufficient concentration to inhibit corrosion of the metal plugs of the partially fabricated integrated circuit surface, and polishing the partially fabricated integrated circuit surface.

34 Claims, 2 Drawing Sheets

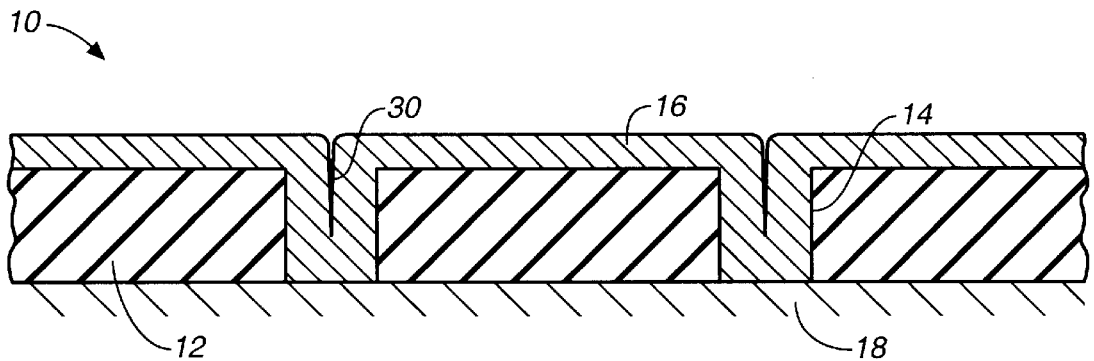
FIG._1A
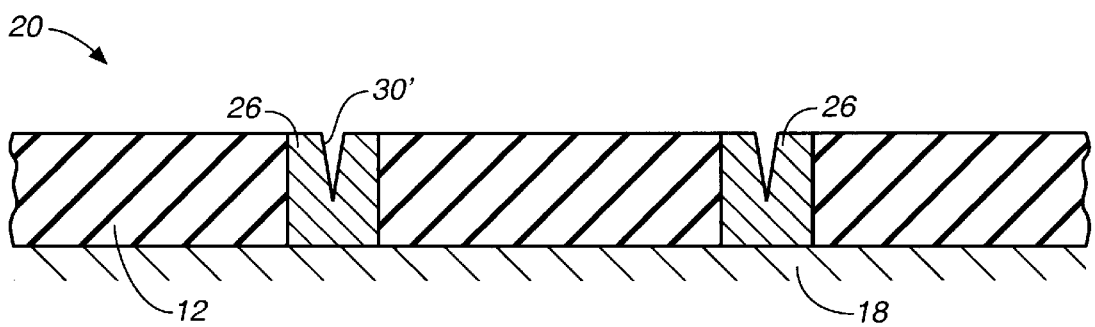
FIG._1B

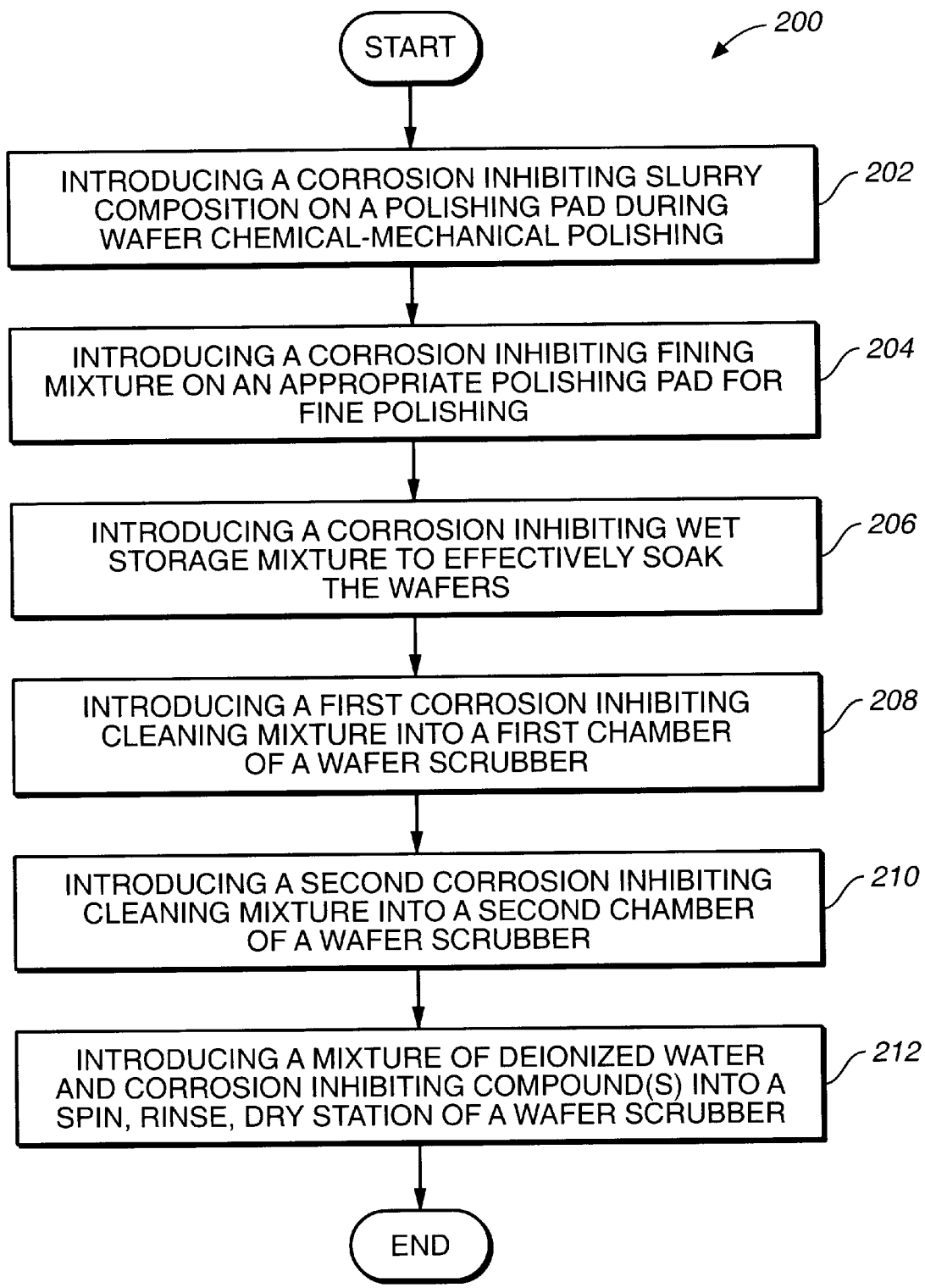
FIG._2

USE OF CORROSION INHIBITING COMPOUNDS TO INHIBIT CORROSION OF METAL PLUGS IN CHEMICAL-MECHANICAL POLISHING

BACKGROUND OF THE INVENTION

The present invention relates to inhibiting corrosion of metal plugs in an integrated circuit, which corrosion may occur during and after a chemical-mechanical polishing (CMP) process of the integrated circuit. More particularly, the present invention relates to using a corrosion inhibiting compound, such as a thiazole compound, during chemical-mechanical polishing (CMP) and/or after CMP to effectively inhibit metal plug corrosion.

Chemical mechanical polishing (sometimes referred to as "CMP") typically involves mounting a wafer face down on a holder and rotating the wafer face against a polishing pad mounted on a platen, which in turn is rotating or is in an orbital state. A slurry containing a chemical that chemically interacts with the facing wafer layer and an abrasive that physically removes that layer is flowed between the wafer and the polishing pad or on the pad near the wafer. In semiconductor wafer fabrication, this technique is commonly applied to planarize various wafer layers such as dielectric layers, metallization layers, etc.

A metal plug, typically a tungsten plug, is formed in a dielectric layer to provide a conductive pathway between a metallization layer and an underlying integrated circuit (IC) substrate layer and/or between two successive metallization layers disposed above the integrated circuit (IC) substrate. FIG. 1A shows a partially fabricated IC 10 that includes a tungsten layer 16, which is subjected to CMP to form tungsten plugs 26 as shown in FIG. 1B. CMP typically involves mounting a substrate face down on a holder and rotating the substrate face against a polishing pad mounted on a pallet, which in turn is rotating or is in orbital state. A slurry containing a chemical, e.g. an oxidizing agent such as ferric nitrate (Fe(NO$_3$)$_3$), that chemically interacts with the tungsten layer and an abrasive, e.g. alumina (Al$_2$O$_3$), that physically removes the tungsten layer, is flowed between the wafer and the polishing pad or on the pad near the substrate.

Referring to FIG. 1A, which shows partially fabricated IC 10 before the substrate surface undergoes CMP. A dielectric layer 12 disposed above a substrate surface 18 and having contact holes 14. A tungsten layer 16 is also disposed atop dielectric layer 12 and fills contact holes 14. Some significant steps involved in forming the partially fabricated IC of FIG. 1A include blanket depositing dielectric layer 12, such as SiO$_2$, on substrate surface 18. After dielectric layer 12 is planarized, a masking layer (not shown), which typically includes photoresist, is blanket deposited over dielectric layer 12 and patterned by conventional photolithography. Next, the unmasked portions of dielectric layer 12 are etched to form contact holes 14 that provide an opening to the underlying substrate layer. After the masking layer is removed, tungsten layer 16 is blanket deposited over the substrate surface, filling contact holes 14 with tungsten. During metal deposition, a vertical "seam" structure 30 forms in the middle region of the contact hole that is filled with tungsten. Those skilled in the art will recognize that before the contact holes are filled with tungsten, they may be filled with a conductive titanium layer (not shown to simplify illustration) and a titanium nitride barrier layer (not shown to simplify illustration). Those skilled in the art will also recognize that vias may be similarly etched to provide an opening in a dielectric layer that is disposed between two metallization layers and that metal plugs may similarly be formed in such vias.

Next, tungsten layer 16 of partially fabricated IC 10 undergoes CMP, as described above, to form tungsten plugs by removing the tungsten layer deposited above the dielectric layer. Now referring to FIG. 1B, which shows a partially fabricated IC 20 after undergoing CMP. Partially fabricated IC has tungsten plugs 26 formed in a dielectric layer 12 disposed atop a substrate 18. During tungsten CMP, ferric nitrate (Fe(NO$_3$)$_3$) oxidizes the tungsten to form tungsten oxide that is abraded by the alumina (Al$_2$O$_3$) particles in the slurry. In this manner, the tungsten layer above the dielectric layer is removed to form tungsten plug 26 shown in FIG. 1B.

Unfortunately, during CMP, the slurry undesirably chemically attacks and opens up seam 30 (shown in FIG. 1A) of the tungsten plug, forming a "V-shaped" crack 30' in the middle region of the plug, as shown in FIG. 1B. This opening in the seam provides a pathway for the slurry, slurry residue and corrosive processing chemicals used in the post CMP cleaning steps to migrate or seep into the tungsten plug. After the crack side-walls have been exposed to these compounds for over a period of time, the tungsten plug corrodes, making the IC susceptible to catastrophic device failure.

What is therefore needed is an improved process, which effectively inhibits metal plug corrosion during the CMP process as well as after CMP, such as during post CMP cleaning steps.

SUMMARY OF THE INVENTION

To achieve the foregoing, the present invention provides a process of inhibiting a corrosion of metal plugs formed in integrated circuits. The corrosion inhibiting process includes providing a partially fabricated integrated circuit surface including the metal plugs on a polishing pad to carry out chemical-mechanical polishing, introducing slurry including a corrosion inhibiting compound on the polishing pad in sufficient concentration to inhibit corrosion of the metal plugs of the partially fabricated integrated circuit surface, and polishing the partially fabricated integrated circuit surface.

The metal plug may include a contact plug or a via plug. The corrosion inhibiting compound may include at least one of sulfur containing compounds, phosphorous containing compounds and azoles. The azoles may include at least one of a thiazole compound and a triazole compound. The concentration of the corrosion inhibiting compound may range from between about 0.0001% (in volume) to a value that is limited by the solubility of the corrosion inhibiting compound in the slurry. In one embodiment, before the step of providing the partially fabricated integrated circuit on the polishing pad, the process of the present invention further includes applying the corrosion inhibiting compound on the partially fabricated integrated circuit surface that is being polished.

In another aspect, the present invention provides another process of inhibiting corrosion of metal plugs formed in integrated circuits. This process of inhibiting corrosion includes providing a partially fabricated integrated circuit surface including the metal plugs, introducing a fining solution including a corrosion inhibiting compound on a polishing pad in sufficient concentration to inhibit corrosion of the metal plugs of the partially fabricated integrated circuit, and fine polishing a surface of the partially fabricated integrated circuit.

The fining solution may include between about 1% and about 3% (in volume) ammonium hydroxide in deionized water. The corrosion inhibiting compound may include at least one of sulfur containing compounds, phosphorous containing compounds and azoles. The concentration of the corrosion inhibiting compound may range from between about 0.0001% (in volume) to a value that is limited by the solubility of the corrosion inhibiting compound in the fining solution.

In yet another aspect, the present invention provides a yet another process of inhibiting corrosion of metal plugs formed in integrated circuits. This process includes providing a partially fabricated integrated circuit surface including the metal plugs and soaking the partially fabricated integrated circuit surface in a rinsing solution including a corrosion inhibiting compound in sufficient concentration to inhibit corrosion of the metal plugs of the partially fabricated integrated circuit surface.

The rinsing solution may include a wet storage solution, in which the partially fabricated integrated circuit surface is soaked. The corrosion inhibiting compound may include at least one of sulfur containing compounds, phosphorous containing compounds and azoles. The concentration of the corrosion inhibiting compound may range from between about 0.0001% (in volume) to a value that is limited by the solubility of the corrosion inhibiting compound in the rinsing solution.

In yet another aspect, the present invention provides a yet another process of inhibiting corrosion of metal plugs formed in integrated circuits. This process of inhibiting corrosion includes providing a partially fabricated integrated circuit surface including the metal plugs; and introducing in a wafer scrubber a cleaning solution including a corrosion inhibiting compound in sufficient concentration to inhibit corrosion of the metal plugs of the integrated circuit.

In embodiment of the present invention, the cleaning solution may further include ammonium hydroxide. The corrosion inhibiting compound may include at least one of sulfur containing compounds, phosphorous containing compounds and azoles. The concentration of the corrosion inhibiting compound may range from between about 0.0001% (in volume) to a value that is limited by the solubility of the corrosion inhibiting the cleaning solution.

In yet another aspect, the present invention provides a corrosion inhibiting slurry composition. The corrosion inhibiting slurry composition includes an oxidizing agent and effective amounts of a corrosion inhibiting compound to inhibit corrosion of a metal plug in an integrated circuit.

The corrosion inhibiting compound may include at least one compound selected from the group consisting of a phosphorous containing compound, a sulfur containing compound and an azole compound. The phosphorous containing compound may include at least one compound selected from the group consisting of acetodisphosphonic acid, nitrilo tris methylene phosphonic acid and methylamino dimethylene phosphonic acid and hydroxyethylidene diphosphonic acid. The sulfur containing compound may include at least one compound selected from the group consisting of zinc sulfate, calcium sulfonate, magnesium sulfate heptahydrate and sulfonated styrene. The azole compound may include at least one compound selected from the group consisting of triazoles, pyrazoles, imidazole, isoxazoles, oxazoles, isothiazoles and thiazoles. The thiazole may include at least one of thiazole, 2-mercaptothiazole, 2-mercaptobenzothiazole, benzothiazole, benzotriazole, and tolyltriazole. The corrosion inhibiting composition may generally range from about 0.0001% (in volume) to a value that is limited by the solubility of the corrosion inhibiting compound in the corrosion inhibiting composition and preferably be between about 0.001% (in volume) and about 2% (in volume).

The oxidizing agent may include at least one compound selected from the group consisting of ferric nitrate, hydrogen peroxide, potassium hydroxide and potassium iodate. The corrosion inhibiting slurry composition may further include a plurality of abrasive particles. The plurality of abrasive particles may include at least one compound selected from the group consisting of alumina, silicon dioxide, and cerium oxide.

In yet another aspect, the present invention provides a corrosion inhibiting composition used after chemical-mechanical polishing of an integrated circuit has concluded. This corrosion inhibiting composition includes deionized water and effective amounts of a corrosion inhibiting compound to inhibit corrosion of a metal plug in an integrated circuit, the effective amounts ranges from about 0.0001% (in volume) to a value that is limited by the solubility of the corrosion inhibiting compound in the corrosion inhibiting composition.

The corrosion inhibiting compound may include at least one compound selected from the group consisting of a phosphorous containing compound, a sulfur containing compound and an azole compound. In one embodiment, the corrosion inhibiting compound of the present invention may further include ammonium hydroxide ranging from between about 0.5% to about 3% by weight. In an alternative embodiment, the corrosion inhibiting compound of the present invention may further include between about 0.5% and about 1% by weight of hydrofluoric acid.

These and other features of the present invention will be described in more detail below in the detailed description of the invention and in conjunction with the following figures.

BRIEF DESCRIPTION OF THE DRAWINGS

FIG. 1A shows a partially fabricated integrated circuit (IC) before undergoing chemical-mechanical polishing (CMP).

FIG. 1B shows a partially fabricated IC that includes tungsten plugs formed by subjecting the partially fabricated IC of FIG. 1A to chemical-mechanical polishing (CMP).

FIG. 2 shows a flowchart of a corrosion inhibiting process, according to one embodiment of the present invention, where the corrosion inhibiting compound can be introduced at any one step of the process or alternatively at any combination of steps.

DETAILED DESCRIPTION OF THE PREFERRED EMBODIMENTS

The present invention provides a composition and process for inhibiting corrosion in metal plugs that may result during CMP and from the post metal CMP cleaning steps. In the following description, numerous specific details are set forth in order to fully illustrate a preferred embodiment of the present invention. It will be apparent, however, that the present invention may be practiced without limitation to some specific details presented herein. By way of example, contact plugs 14 of FIG. 1, as described above, may be filled with other metals or conductive materials, besides tungsten, such as aluminum and copper and then the metal on the substrate surface may undergo chemical-mechanical polishing (CMP). As a further example, the composition of the slurry employed during CMP may include other oxidizing agents, besides ferric nitrate ($Fe(NO_3)_3$), such as hydrogen peroxide ($H_2O_2$) and potassium iodate ($KIO_3$) to oxidize the metal composition of the plug. Further still, although the present invention is described in terms of polishing a semiconductor wafer specifically, the teachings of the present invention apply to CMP of integrated circuits generally.

The present invention recognizes the need for inhibiting corrosion in metal plugs and metal components of the equipment that may result from CMP, post metal CMP processing and cleaning steps. According to one embodiment of the present invention, a corrosion inhibiting compound, e.g., a thiazole compound, is incorporated into the slurry composition used during CMP. In another embodiment of the present invention, the corrosion inhibiting compound is incorporated into the fine polishing solution used at the buffing or fine polishing stage after CMP. Further embodiments of the present invention incorporate the corrosion inhibiting compound into various cleaning solutions used in wet storage and in various chambers of a wafer scrubber system.

FIG. 2 shows a flowchart of a corrosion inhibiting process 200, according to one embodiment of the present invention, for effectively inhibiting metal plug corrosion. Although FIG. 2 may show that a corrosion inhibiting compound is introduced at each step, it should be clarified that depending on the application and the compositions of the slurry and/or cleaning solutions employed, the corrosion inhibiting compound may be introduced at any combination of steps or at any one step of process 200. In a preferred embodiment, however, corrosion inhibiting compound of the present invention is introduced when the wafer undergoes CMP. The process of FIG. 2 begins after bulk tungsten deposition has concluded and a partially fabricated wafer surface like the one shown in FIG. 1B is formed by the process described above.

Corrosion inhibiting process 200 may begin at a step 202, when an integrated circuit, such as a semiconductor wafer undergoes CMP. In this step the wafer is mounted on a wafer holder, having the active surface of the rotating wafer face down against a polishing pad, which either rotates or is an orbital motion. Step 202 includes introducing on the polishing pad a corrosion inhibiting slurry composition according to the present invention, i.e. having a thiazole compound incorporated into the conventional slurry composition that contains an oxidizing agent and abrasive particles. In those applications where the abrasive particles are absent from the slurry composition, e.g., the abrasive particles are provided on the polishing pad itself, the corrosion inhibiting slurry composition includes the thiazole compound admixed with the oxidizing agent, without the abrasive particles.

In this step, the slurry of the present invention is introduced on the polishing pad to facilitate wafer CMP. As mentioned before, the oxidizing agent in the slurry oxidizes the tungsten to form tungsten oxide, which is abraded and removed from the wafer surface by the abrasive particles in the slurry or on the polishing pad. According to the present invention, at this point, the wafer surface undergoing polishing, particularly the side-walls of the seams in the tungsten plug, is coated with the thiazole compound in the slurry composition, which effectively inhibits corrosion of the metal plug. While intending not to be bound by theory, the present invention recognizes that the thiazole compound does not contact the wafer surface for long enough periods for the corrosion inhibiting property of the thiazole compound to retard or interfere with the oxidation of the tungsten layer in the plug because the thiazole coating at the polishing front is constantly being removed by the abrasive action of the abrasive particles on the wafer surface during polishing. At the conclusion of the polishing process, the thiazole coating remaining on the wafer surface effectively inhibits tungsten plug corrosion.

In a preferred embodiment, before step 202 commences, the wafer surface is soaked with the thiazole compound alone, i.e. in the absence of a slurry composition, by placing some drops of the thiazole compound on the wafer surface, for example. This ensures that the thiazole seeps into the vertical seam and effectively coats at least a substantial portion of the seam side-walls extending all the way into the plug. During subsequent wafer CMP, the slurry composition including the thiazole may be introduced and CMP proceeds as described above. It is worth noting, however, that the coating of thiazole on the seam side-walls remains well protected from being removed during polishing because a substantial portion of the seam does not contact the polishing pad during CMP. In this manner, the present invention provides a concentrated dose of the corrosion inhibiting compound to the seams, which are extremely susceptible to corrosion and cracking.

According to the present invention, the corrosion inhibiting compound may similarly be incorporated into other reagents used in a post CMP processing step, including post CMP cleaning steps. By way of example, the thiazole may be incorporated into a fining solution introduced typically during fine polishing. As a further example, the thiazole compound may be incorporated into cleaning solutions employed in the various chambers of a wafer scrubber. To facilitate a clear understanding, a detailed explanation of how the thiazole compound is introduced during fine polishing and/or post CMP wafer cleaning is set forth hereinafter.

In a step 204, the corrosion inhibiting compound is incorporated into a fining solution to produce a corrosion inhibiting mixture, which is introduced on an appropriate polishing pad for fine polishing the wafer. Typically during fine polishing, also well known in the art as "buffing," the wafer undergoes polishing that is far less coarse than the CMP process described in step 202. In other words, the fining solution may not contain abrasive particles to initiate any abrasions on the wafer surface during polishing. This step is typically employed in some wafer fabrication applications to remove a contaminated wafer layer, i.e. including contaminants from the slurry residue and/or eroded material, resulting from the CMP process. Conventionally, the fining solution includes a dilute solution of a surfactant, such as between about 1% and about 3% (in volume) of ammonium hydroxide ($NH_4OH$) in deionized water. For effective fine polishing, an increase in the $NH_4OH$ concentration, for example, may drive up the pH of the fining solution to a value that is higher than about 10, at which pH the fining solution may rapidly attack the metal composition of the plug. Therefore, according to one embodiment of the present invention, metal plug corrosion may be inhibited by incorporating the thiazole compound into the fining solution.

A step 206 includes introducing the thiazole compound in a bath of deionized water to form a corrosion inhibiting bath intended for wet storage of wafers. Typically, the wafers are soaked or drenched in a bath of deionized water, before they are subjected to vigorous cleaning in a wafer scrubber by various cleaning solutions. The present invention recognizes that the transition from one compositional liquid to another, as well as exposure to air, can increase the metal plug's chemical reactivity and thus increase the likelihood of corrosion. Therefore, the corrosion inhibiting wet storage mixture, according to the present invention, includes the thiazole compound to effectively inhibit metal plug corrosion.

Depending on the type of equipment employed for post CMP cleaning, this step may take place in the wafer scrubber that has integrated into it a wet storage station. By way of example, in a DSS 200 Series 2 Wafer Scrubber System, commercially available from OnTrak Systems, of San Jose, Calif., a wet storage station is integrated into the wafer scrubber assembly and a separate wet storage station may not be necessary. If the wafer scrubber does not come equipped with a wet storage station, then the wafers may be immersed in a bath that includes the thiazole compound and deionized water. Before the wafers are sent to the wafer scrubber, however, they are dried in a drying chamber or are transported wet.

A step 208 includes introducing a first corrosion inhibiting cleaning mixture into a first chamber of a wafer scrubber. By way of example, in the first chamber (also known in the art as a "primary chamber') of the above mentioned OnTrak wafer scrubber is a brush box that is fitted with brushes on the top and bottom such that both sides of the wafer undergo vigorous scrubbing during cleaning. The primary chamber is typically employed for removing particle contaminants from the partially fabricated wafer surface. The particle contaminants, such as metal oxides, removed in this chamber typically originate from the slurry composition or may be part of the eroded material from the wafer surface during CMP. Typically such metal oxides adhere to the wafer surface due to the build up of electrostatic charge on the wafer surface.

Conventionally, in this chamber, a cleaning mixture such as a solution containing 2% (in volume) ammonium hydroxide $NH_4OH$ and deionized water is introduced to provide an appropriate pH on the wafer surface to facilitate the separation of the metal oxide from the dielectric layer and the brushes. In the corrosion inhibiting cleaning mixture composition, according to the present invention, however, the thiazole compound is admixed with the conventional cleaning solution composition. The action of the rotating brushes, which physically contact the wafer surface, in combination with the improved cleaning mixture containing the thiazole compound, effectively remove such metal oxide particles from the wafer surface without the corrosive damage to the metal plugs that might otherwise occur.

In a step 210, a second corrosion inhibiting cleaning mixture including the thiazole compound is added to a second chamber. By way of example, in the above mentioned OnTrak wafer scrubber the second chamber is referred to as the "secondary chamber" in the art. In this chamber, a contaminated dielectric layer, enriched with metal contaminants embedded into a dielectric layer during metal CMP, typically undergoes scrubbing in the presence of (between about 0.5% and about 1% by volume) hydrofluoric acid and the thiazole compound. In this chamber, typically the impurities embedded into a wafer layer are removed as opposed to removing contaminants adhering to the wafer surface in the first chamber of step 208. According to the cleaning process of the present invention, scrubbing with the improved cleaning mixture containing a thiazole compound inhibits the corrosion of the metal plug and the likelihood of metal plug degradation is reduced significantly.

Finally in a step 212, a corrosion inhibiting compound, such as the thiazole compound is introduced along with the deionized water in the spin, rinse, dry station of a wafer scrubber. In the spin, rinse, dry, station, chemical residue from the cleaning mixtures of steps 208 and 210 mentioned above are removed from the substrate surface. In step 212, the wafer is secured on a chuck and sprayed with deionized water admixed with the thiazole compound to rinse off the chemicals on the substrate surface. Next, the chuck switches to a high speed rotation, which literally throws the water off the wafer surface. The substrate surface is then dried by the radiant heat that may be generated by bright light.

The wafer surface after being treated with the thiazole compound in any single step described above will be resistant to corrosion. It is also important to note, however, that the inclusion of the thiazole compound in the cleaning solutions employed in the various chambers or stations of the wafer scrubber also inhibits the corrosion of the brushes and other metal based machinery in the wafer scrubber. Those skilled in the art will recognize that the various parts of the wafer scrubber that come in contact with the cleaning solution of the present invention are also effectively coated with the thiazole compound. Therefore, the corrosion inhibiting compounds of the present invention not only inhibit metal plug corrosion, but also inhibit the corrosion of the machinery employed during post CMP cleaning and thereby prolong the life of such machinery. Furthermore, metallic contaminants on the wafer surface resulting from the corroded wafer scrubber machinery are also significantly reduced.

It should be borne in mind that the corrosion inhibiting compounds of the present invention may include other corrosion inhibiting compounds besides the thiazole compound, such as phosphorous, sulfur and other azole compounds. By way of example, representative sulfur containing compounds include zinc sulfate, calcium sulfonate, magnesium sulfate heptahydrate, sulfonated styrene, etc. Representative phosphorous containing compounds include acetodisphosphonic acid, nitrilo tris methylene phosphonic acid and methylamino dimethylene phosphonic acid, hydroxyethylidene diphosphonic acid, etc. Representative azole compounds include triazoles, pyrazoles, imidazole, isoxazoles, oxazoles, isothiazoles and thiazoles. In a preferred embodiment, however, the corrosion inhibiting compound of the present invention is a thiazole or a triazole compound. Suitable thiazoles include thiazole itself, 2-mercaptothiazole, 2-mercaptobenzothiazole, benzothiazole, etc. Suitable triazoles include triazole itself, benzotriazole, tolyltriazole, etc. The above list of compounds should not be construed as an exhaustive list and those skilled in the art will recognize that other compounds, such as chromates may be used as corrosion inhibitor compounds of the present invention. Furthermore, the corrosion inhibiting compounds may also contain any combination of the above mentioned compounds.

The corrosion inhibiting compounds of the present invention may be present in effective amounts in the CMP slurry, the fine polishing solution and cleaning and rinsing solutions, which are referred to as "liquid solutions or mixtures" hereinafter, to effectively inhibit metal plug corrosion. The concentration of the corrosion inhibiting compound(s) present in these liquid solutions or mixtures may generally range from a lower limit of about 0.0001% (in volume) to a value that is limited by the solubility of the corrosion inhibiting compound in the liquid solutions or mixtures. The concentration of the corrosion inhibiting compound in the above mentioned liquid solutions or mixtures may preferably be between about 0.001% and about 2% (in volume). By way of example, the corrosion inhibiting slurry composition may include benzotriazole that is between about 0.0001% (in volume) to a value that is limited by the solubility of benzotriazole in the slurry composition.

Although the foregoing invention has been described in some detail for purposes of clarity of understanding, it will be apparent that certain changes and modifications may be practiced within the scope of the appended claims. For example, while the specification describes introducing the corrosion inhibiting compound during CMP and certain post CMP processing and cleaning steps, there is no reason why in principle the corrosion inhibiting compound of the present invention cannot be introduced in other post-CMP operations. Therefore, the present embodiments are to be considered as illustrative and not restrictive, and the invention is not to be limited to the details given herein, but may be modified within the scope of the appended claims.

What is claimed is:

1. A process of inhibiting corrosion of metal plugs formed in integrated circuits, comprising:
applying a corrosion inhibiting compound on a partially fabricated integrated circuit surface in a manner allowing the corrosion inhibiting compound to seep into a seam of said metal plug and effectively coat a substantial portion of seam side-walls extending into the metal plug;
contacting the partially fabricated integrated circuit surface including said metal plugs with a polishing pad to carry out chemical-mechanical polishing;
introducing a slurry including a corrosion inhibiting compound on the polishing pad in sufficient concentration to further inhibit corrosion of said metal plugs of said partially fabricated integrated circuit surface; and
polishing said partially fabricated integrated circuit surface including the metal plugs wherein the corrosion inhibiting compound is applied to said partially fabricated integrated circuit surface prior to contacting said partially fabricated integrated circuit surface with the polishing pad.

2. The process of claim 1, wherein the metal plugs comprise contact plugs or via plugs.

3. The process of claim 1, wherein the slurry includes an oxidizing agent and a plurality of abrasive particles.

4. The process of claim 1, wherein the corrosion inhibiting compound is selected from the group consisting of sulfur containing compounds, phosphorous containing compounds and azole containing compounds.

5. The process of claim 4, wherein the corrosion inhibiting compound is selected from the group consisting of triazoles, pyrazoles, imidazole, isoxazoles, oxazoles, isothiazoles and thiazoles.

6. The process of claim 1, wherein the concentration of the corrosion inhibiting compound ranges from between about 0.0001% (in volume) to a value that is limited by the solubility of the corrosion inhibiting compound in the slurry at operating conditions.

7. The process of claim 4, wherein the corrosion inhibiting compound includes at least one compound selected from the group consisting of acetodisphosphonic acid, nitrilo tris methylene phosphonic acid, methylamino dimethylene phosphonic acid, hydroxyethylidene diphosphonic acid, zinc sulfate, calcium sulfonate, magnesium sulfate heptahydrate, and sulfonated styrene.

8. The process of claim 6, wherein the corrosion inhibiting composition includes at least one of 2-mercaptothiazole, 2-mercaptobenzothiazole, benzothiazole, benzotriazole, and tolyltriazole present in a concentration of between about 0.001% (in volume) and about 2% (in volume).

9. The process of claim 3, wherein said oxidizing agent includes at least one compound selected from the group consisting of ferric nitrate, hydrogen peroxide, potassium hydroxide and potassium iodate.

10. The process of claim 3, wherein the plurality of abrasive particles include at least one compound selected from the group consisting of alumina, silicon dioxide, and cerium oxide.

11. A process of inhibiting corrosion of metal plugs formed in integrated circuits, comprising:
providing a partially fabricated integrated circuit surface including said metal plugs;
polishing the partially fabricated integrated circuit surface including the metal plugs with a slurry;
introducing a fining solution including a corrosion inhibiting compound on a polishing pad in sufficient concentration to inhibit corrosion of said metal plugs of said partially fabricated integrated circuit; and
fine polishing a surface of said partially fabricated integrated circuit including said metal plugs.

12. The process of claim 11, wherein the fining solution includes between about 1% and about 3% (in volume) ammonium hydroxide in deionized water.

13. The process of claim 11, wherein the corrosion inhibiting compound is selected from the group consisting of sulfur containing compounds, phosphorous containing compounds and azole containing compounds.

14. The process of claim 13, wherein the corrosion inhibiting compound is selected from the group consisting of triazoles, pyrazoles, imidazole, isoxazoles, oxazoles, isothiazoles and thiazoles.

15. The process of claim 11, wherein the concentration of the corrosion inhibiting compound ranges from between about 0.0001% (in volume) to a value that is limited by the solubility of the corrosion inhibiting compound in the fining solution at operating conditions.

16. The process of claim 10, wherein the corrosion inhibiting compound includes at least one compound selected from the group consisting of acetodisphosphonic acid, nitrilo tris methylene phosphonic acid, methylamino dimethylene phosphonic acid, hydroxyethylidene diphosphonic acid, zinc sulfate, calcium sulfonate, magnesium sulfate heptahydrate and sulfonated styrene.

17. The process of claim 15, wherein the corrosion inhibiting composition includes at least one of 2-mercaptothiazole, 2-mercaptobenzothiazole, benzothiazole, benzotriazole, and tolyltriazole present in a concentration of between about 0.001% (in volume) and about 2% (in volume).

18. The process of claim 21, wherein the rinsing solution includes deionized water.

19. The process of claim 21, wherein the rinsing solution further comprising ammonium hydroxide ranging from between about 0.5% to about 3% in the corrosion inhibiting composition.

20. The process of claim 21, wherein the rinsing solution further comprising between about 0.5% and about 1% by weight of hydrofluoric acid in the corrosion inhibiting composition.

21. A process of inhibiting corrosion of metal plugs formed in integrated circuits, comprising:
providing a partially fabricated integrated circuit surface including said metal plugs; and
soaking said partially fabricated integrated circuit surface in a rinsing solution including a corrosion inhibiting compound in sufficient concentration to inhibit corrosion of said metal plugs of said partially fabricated integrated circuit surface.

22. The process of claim 21, wherein the rinsing solution comprises a wet storage solution, in which the partially fabricated integrated circuit surface is soaked.

23. The process of claim 21, wherein the corrosion inhibiting compound includes is selected from the group consisting of sulfur containing compounds, phosphorous containing compounds and azole containing compounds.

24. The process of claim 23, wherein the corrosion inhibiting compound is selected from the group consisting of triazoles, pyrazoles, imidazole, isoxazoles, oxazoles, isothiazoles and thiazoles.

25. The process of claim 21, wherein the concentration of the corrosion inhibiting compound ranges from between about 0.0001% (in volume) to a value that is limited by the solubility of the corrosion inhibiting compound in the rinsing solution at operating conditions.

26. The process of claim 23, wherein the corrosion inhibiting compound includes at least one compound selected from the group consisting of acetodisphosphonic acid, nitrilo tris methylene phosphonic acid, methylamino dimethylene phosphonic acid, hydroxyethylidene diphosphonic acid, zinc sulfate, calcium sulfonate, magnesium sulfate heptahydrate and sulfonated styrene.

27. The process of claim 25, wherein the corrosion inhibiting composition includes at least one of 2-mercaptothiazole, 2-mercaptobenzothiazole, benzothiazole, benzotriazole, and tolyltriazole present in a concentration of between about 0.001% (in volume) and about 2% (in volume).

28. A process of inhibiting corrosion of metal plugs formed in integrated circuits, comprising:

providing a partially fabricated integrated circuit surface including said metal plugs; and introducing in a wafer scrubber a cleaning solution including a corrosion inhibiting compound in sufficient concentration to inhibit corrosion of said metal plugs of said integrated circuit.

29. The process of claim 28, wherein the cleaning solution includes ammonium hydroxide.

30. The process of claim 28, wherein the corrosion inhibiting compound is selected from the group consisting of sulfur containing compounds, phosphorous containing compounds and azole containing compounds.

31. The process of claim 30, wherein the corrosion inhibiting compound is selected from the group consisting of triazoles, pyrazoles, imidazole, isoxazoles, oxazoles, isothiazoles and thiazoles.

32. The process of claim 28, wherein the concentration of the corrosion inhibiting compound ranges from between about 0.0001% (in volume) to a value that is limited by the solubility of the corrosion inhibiting the cleaning solution at operating conditions.

33. The process of claim 30, wherein the corrosion inhibiting compound includes at least one compound selected from the group consisting of acetodisphosphonic acid, nitrilo tris methylene phosphonic acid, methylamino dimethylene phosphonic acid, hydroxyethylidene diphosphonic acid, zinc sulfate, calcium sulfonate, magnesium sulfate heptahydrate and sulfonated styrene.

34. The process of claim 32, wherein the corrosion inhibiting composition is between about 0.001% (in volume) and about 2% (in volume).

* * * * *